United States Patent
Senior et al.

(10) Patent No.: US 10,120,581 B2
(45) Date of Patent: Nov. 6, 2018

(54) GENERATING COMPRESSED DATA STREAMS WITH LOOKBACK PRE-FETCH INSTRUCTIONS FOR PRE-FETCHING DECOMPRESSED DATA FROM A LOOKBACK BUFFER

(71) Applicant: QUALCOMM Incorporated, San Diego, CA (US)

(72) Inventors: Richard Senior, San Diego, CA (US); Amin Ansari, San Diego, CA (US); Vito Remo Bica, Poway, CA (US); Jinxia Bai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 15/085,399

(22) Filed: Mar. 30, 2016

(65) Prior Publication Data

US 2017/0285939 A1 Oct. 5, 2017

(51) Int. Cl.
*G06F 3/06* (2006.01)
*H03M 7/30* (2006.01)

(52) U.S. Cl.
CPC .............. *G06F 3/061* (2013.01); *G06F 3/064* (2013.01); *G06F 3/0656* (2013.01);
(Continued)

(58) Field of Classification Search
CPC . H03M 7/3086; H03M 7/6017; H03M 7/6029
See application file for complete search history.

(56) References Cited

U.S. PATENT DOCUMENTS 5,805,086 A 9/1998 Brown et al.
6,879,266 B1 * 4/2005 Dye .................... G06F 12/08
341/51

(Continued)

FOREIGN PATENT DOCUMENTS

GB 2513987 A 11/2014

OTHER PUBLICATIONS

Salomon, David, "Data Compression: The Complete Reference," 4th Edition, Jan. 1, 1998, Springer, New York, pp. 101-162, 357-360.

(Continued)

*Primary Examiner* — Ann J Lo
*Assistant Examiner* — Jane Wei
(74) *Attorney, Agent, or Firm* — W&T/Qualcomm

(57) ABSTRACT

Aspects for generating compressed data streams with lookback pre-fetch instructions are disclosed. A data compression system is provided and configured to receive and compress an uncompressed data stream as part of a lookback-based compression scheme. The data compression system determines if a current data block was previously compressed. If so, the data compression system is configured to insert a lookback instruction corresponding to the current data block into the compressed data stream. Each lookback instruction includes a lookback buffer index that points to an entry in a lookback buffer where decompressed data corresponding to the data block will be stored during a separate decompression scheme. Once the data blocks have been compressed, the data compression system is configured to move a lookback buffer index of each lookback instruction in the compressed data stream into a lookback pre-fetch instruction located earlier than the corresponding lookback instruction in the compressed data stream.

28 Claims, 9 Drawing Sheets

(52) U.S. Cl.
CPC ........ *G06F 3/0673* (2013.01); *H03M 7/3086* (2013.01); *H03M 7/6017* (2013.01); *H03M 7/6029* (2013.01)

(56) References Cited

U.S. PATENT DOCUMENTS

| | | |
|---|---|---|
| 6,981,119 B1 | 12/2005 | Lepak et al. |
| 7,129,860 B2 | 10/2006 | Alvarez, II et al. |
| 8,612,676 B2 | 12/2013 | Dahlen et al. |
| 9,026,740 B1 | 5/2015 | Shilane et al. |
| 9,287,893 B1 | 3/2016 | Pflederer |
| 2011/0043387 A1* | 2/2011 | Abali .................. H03M 7/3088 341/51 |
| 2013/0311722 A1* | 11/2013 | Arelakis ................. H03M 7/40 711/122 |

OTHER PUBLICATIONS

International Search Report and Written Opinion for PCT/US2017/020356, dated Jun. 1, 2017, 16 pages.

* cited by examiner

GENERATING COMPRESSED DATA STREAMS WITH LOOKBACK PRE-FETCH INSTRUCTIONS FOR PRE-FETCHING DECOMPRESSED DATA FROM A LOOKBACK BUFFER

BACKGROUND

I. Field of the Disclosure

The technology of the disclosure relates generally to data compression techniques, and more particularly to lookback-based data compression techniques.

II. Background

Data compression is used in processor-based systems to reduce data size. Reducing data size can reduce memory needed to store a given amount of data. Reducing memory size can thus lower the area needed for memory circuits in an integrated circuit, thereby lowering costs of the integrated circuit. Reducing memory size can also reduce static energy by reducing on-chip retention power needed to retain data in memory. Data compression can also reduce the amount of data transfer bandwidth needed for reading data from and writing data to memory, thus increasing performance.

In this regard, lookback-based data compression is one conventional type of data compression technique used in processor-based systems. Lookback-based compression involves compressing data such that during compression, if multiple instances of the same uncompressed data block appear in an uncompressed data stream, a lookback instruction is inserted into the compressed data stream when compressing subsequent instances of the uncompressed data block. This is as opposed to storing multiple instances of the compressed data in the compressed data stream. Then, during decompression of the compressed data stream, decompressed data is provided to an output decompressed data stream and stored in a lookback buffer. In this manner, if a lookback instruction in the compressed data stream is encountered during decompression, this means that the data block related to the lookback instruction has already been decompressed and stored in the lookback buffer during an earlier stage of decompression. Thus, rather than decompressing subsequent instances of the data block by providing a raw data stream or accessing a dictionary, a lookback instruction points to a copy of the decompressed data block stored in a lookback buffer and provides the decompressed data block from the lookback buffer as an output. In this manner, the lookback instruction can be used to retrieve an instance of the decompressed data block corresponding to the lookback buffer instruction from the lookback buffer, such that decompression latency is reduced. Providing a decompressed data block from a lookback buffer in this manner reduces decompression time, and also allows the compressed data stream to store pointers to the lookback buffer rather than the data block itself, thus reducing the size of the compressed data stream.

Although a lookback-based compression scheme reduces decompression time and the compressed data stream size, a lookback buffer is conventionally placed in higher level memory located on a chip (e.g., cache memory), rather than placing a lookback buffer in lower level memory not located on a chip (e.g., main memory). Notably, a lookback buffer is conventionally placed in higher level memory located on a chip due to faster access times of higher level memory as compared to slower access times of lower level memory. However, placing a lookback buffer in higher level memory located on a chip increases the overall chip area. Thus, employing a conventional lookback buffer for decompression has an associated chip area penalty.

SUMMARY OF THE DISCLOSURE

Aspects disclosed in the detailed description include generating compressed data streams with lookback pre-fetch instructions for pre-fetching decompressed data from a lookback buffer. In one aspect, a data compression system is provided and configured to receive and compress an uncompressed data stream as part of a lookback-based compression scheme. For data blocks in the uncompressed data stream, the data compression system determines if a current data block was previously compressed. If the current data block was previously compressed, the data compression system is configured to insert a lookback instruction corresponding to the current data block into the compressed data stream. Each lookback instruction in the compressed data stream includes a lookback buffer index that points to an entry in a lookback buffer where decompressed data corresponding to the data block will be stored during a separate decompression scheme. Once all of the data blocks have been compressed, the data compression system is configured to move a lookback buffer index of each lookback instruction in the compressed data stream into a lookback pre-fetch instruction located earlier than the corresponding lookback instruction in the sequence of instructions of the compressed data stream. Thus, each lookback pre-fetch instruction is scheduled to be accessed before the corresponding lookback instruction is decompressed. Moving each lookback buffer index earlier in the compressed data stream to a lookback pre-fetch instruction to allow for pre-fetching of previously decompressed data allows data for each lookback instruction to be pre-fetched prior to accessing the lookback instruction during decompression. This is opposed to not including lookback pre-fetch instructions in the compressed data stream such that the corresponding decompressed data is retrieved from the lookback buffer while processing the corresponding lookback instruction during decompression.

Pre-fetching decompressed data from a lookback buffer in this manner allows the lookback buffer to be employed in lower level memory rather than higher level memory, because pre-fetching the decompressed data mitigates the slower access latency of lower level memory. In other words, if a lookback buffer is placed in lower level memory, retrieving decompressed data stored in the lookback buffer may take more time compared to retrieving decompressed data from a lookback buffer placed in higher level memory due to the slower access latency of lower level memory. However, pre-fetching decompressed data from a lookback buffer prior to processing the corresponding lookback instruction during decompression mitigates the slower access latency of lower level memory. Such mitigation is achieved because the decompressed data is available prior to processing the lookback instruction. Thus, pre-fetching data corresponding to lookback instructions allows for the reduced decompression time and reduced compressed data stream size of lookback-based compression even when employing a lookback buffer in lower level memory. Notably, employing the lookback buffer in lower level memory avoids or reduces a chip area penalty associated with placing the lookback buffer in higher level memory.

In this regard in one aspect, a data compression system is provided. The data compression system comprises a data stream input circuit configured to receive an uncompressed data stream comprising a plurality of data blocks. The data compression system also comprises a compression engine. The compression engine is configured to generate a compressed data stream from the uncompressed data stream. The compression engine is configured to generate a compressed data stream by being configured to determine if a current data block of the plurality of data blocks in the uncompressed data stream was previously compressed by the compression engine. The compression engine is configured to generate a compressed data stream by being further configured to insert a lookback instruction corresponding to the current data block into the compressed data stream responsive to determining that the current data block of the plurality of data blocks was previously compressed by the compression engine. The lookback instruction comprises a lookback buffer index that points to an entry in a lookback buffer that stores data to be provided during decompression of the lookback instruction. The compression engine is also configured to move the lookback buffer index corresponding to each lookback instruction in the compressed data stream to a corresponding lookback pre-fetch instruction in the compressed data stream that is scheduled to be accessed before a corresponding lookback instruction during decompression.

In another aspect, a method for generating a compressed data stream with lookback pre-fetch instructions is provided. The method comprises receiving an uncompressed data stream comprising a plurality of data blocks. The method also comprises generating a compressed data stream from the uncompressed data stream. Generating the compressed data stream comprises determining if a current data block of the plurality of data blocks in the uncompressed data stream was previously compressed by a compression engine. Generating the compressed data stream also comprises inserting a lookback instruction corresponding to the current data block into the compressed data stream responsive to determining that the current data block of the plurality of data blocks was previously compressed by the compression engine. The lookback instruction comprises a lookback buffer index that points to an entry in a lookback buffer that stores data to be provided during decompression of the lookback instruction. The method also comprises moving the lookback buffer index corresponding to each lookback instruction in the compressed data stream to a corresponding lookback pre-fetch instruction in the compressed data stream that is scheduled to be accessed before a corresponding lookback instruction during decompression.

In another aspect, a data compression system is provided. The data compression system comprises a means for receiving an uncompressed data stream comprising a plurality of data blocks. The data compression system also comprises a means for generating a compressed data stream from the uncompressed data stream. The means for generating a compressed data stream comprises a means for determining if a current data block of the plurality of data blocks in the uncompressed data stream was previously compressed by the means for generating the compressed data stream. The means for generating a compressed data stream also comprises a means for inserting a lookback instruction corresponding to the current data block into the compressed data stream responsive to determining that the current data block of the plurality of data blocks was previously compressed by the means for generating the compressed data stream. The lookback instruction comprises a lookback buffer index that points to an entry in a lookback buffer that stores data to be provided during decompression of the lookback instruction. The data compression system also comprises a means for moving the lookback buffer index corresponding to each lookback instruction in the compressed data stream to a corresponding lookback pre-fetch instruction in the compressed data stream that is scheduled to be accessed before a corresponding lookback instruction during decompression.

In another aspect, a processing system is provided. The processing system comprises a processor, a data decompression system configured to decompress a compressed data stream, a lookback buffer comprised of lower level memory that is placed separately from the data decompression system, and a data compression system. The data compression system comprises a data stream input circuit configured to receive an uncompressed data stream comprising a plurality of data blocks. The data compression system also comprises a compression engine. The compression engine is configured to generate a compressed data stream from the uncompressed data stream. The compression engine is configured to generate the compressed data stream by being configured to determine if a current data block of the plurality of data blocks in the uncompressed data stream was previously compressed by the compression engine. The compression engine is configured to generate the compressed data stream by being further configured to insert a lookback instruction corresponding to the current data block into the compressed data stream responsive to determining that the current data block of the plurality of data blocks was previously compressed by the compression engine. The lookback instruction comprises a lookback buffer index that points to an entry in the lookback buffer that stores data to be provided during decompression of the lookback instruction. The compression engine is also configured to move the lookback buffer index corresponding to each lookback instruction in the compressed data stream to a corresponding lookback pre-fetch instruction in the compressed data stream that is scheduled to be accessed before a corresponding lookback instruction during decompression.

DETAILED DESCRIPTION

Figure 1:
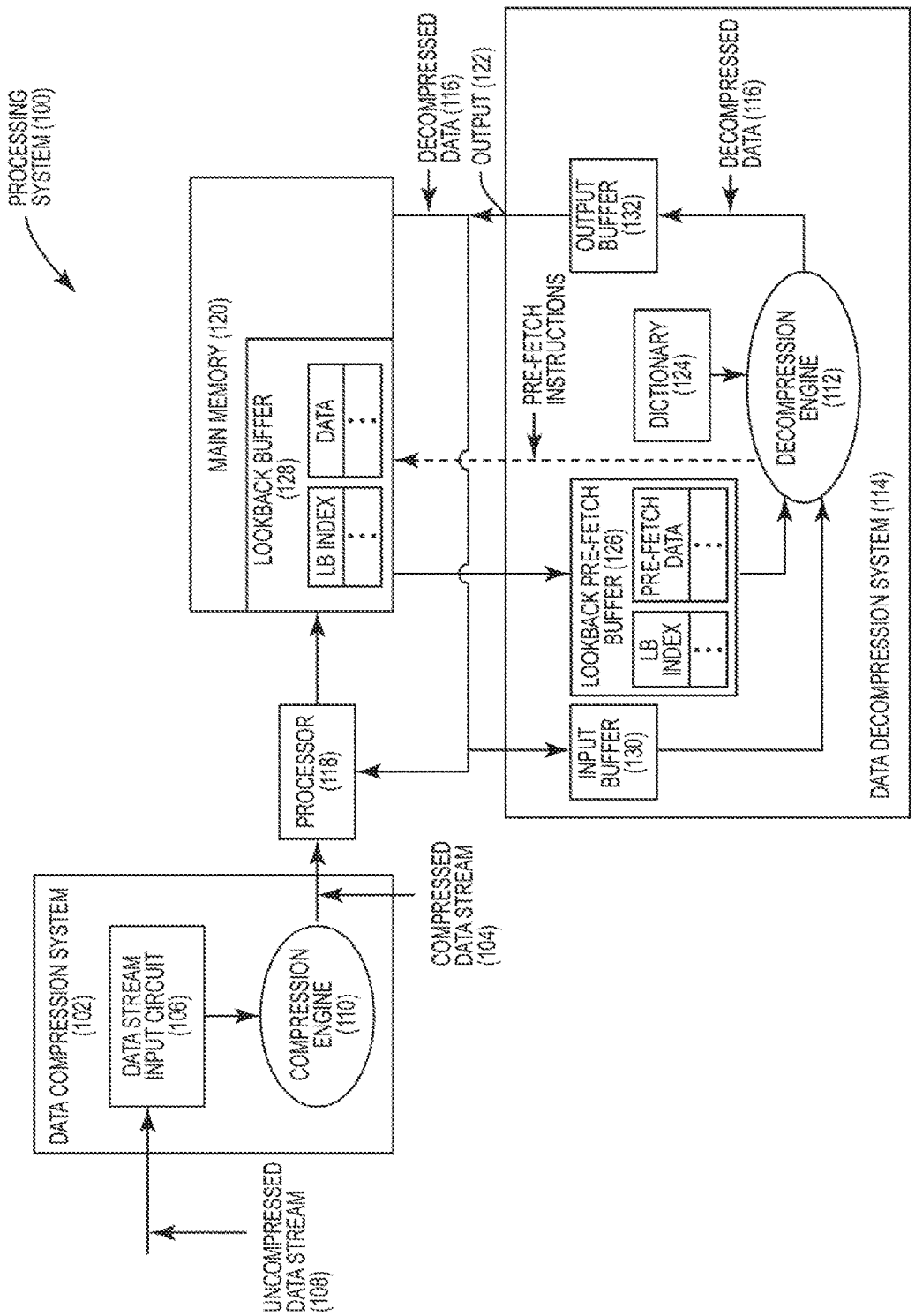
FIG. 1 is a block diagram of an exemplary processing system with a data compression system that employs lookback-based compression employing lookback pre-fetch instructions and a lookback buffer.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
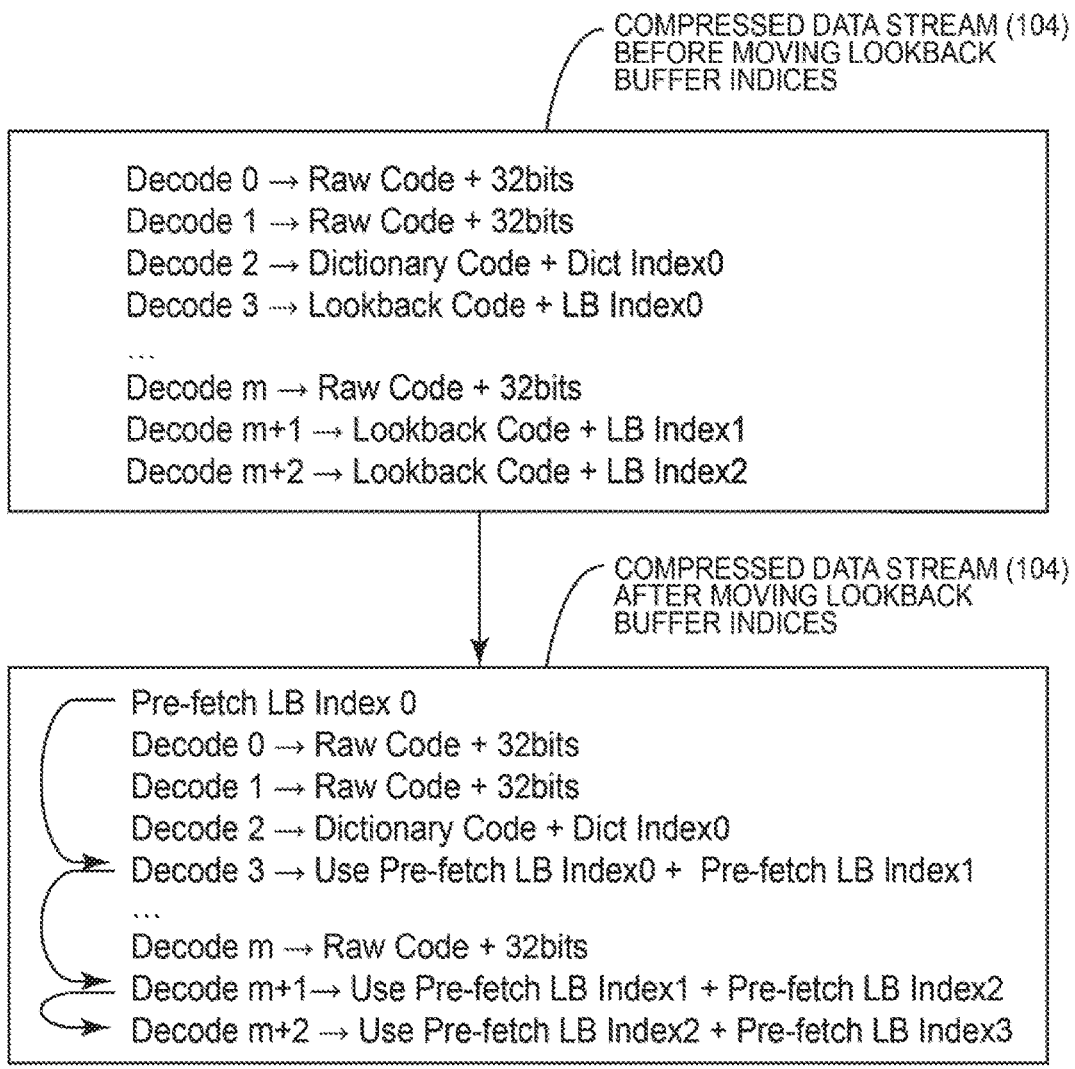
FIG. 2 is a diagram of an exemplary compressed data stream with lookback pre-fetch instructions that may be generated by the data compression system in FIG. 1.

FIG. 1 illustrates an exemplary processing system 100 with a data compression system 102 that employs lookback-based compression with lookback pre-fetch instructions. FIG. 2 illustrates a compressed data stream 104 generated by the data compression system 102, which will be discussed in conjunction with FIG. 1.

With regard to FIG. 1, the data compression system 102 includes a data stream input circuit 106 configured to receive an uncompressed data stream 108. The uncompressed data stream 108 includes multiple data blocks (not shown) and is provided from the data stream input circuit 106 to a compression engine 110 configured to generate the compressed data stream 104 from the uncompressed data stream 108. The compression engine 110 may generate the compressed data stream 104 by inserting each data block into a particular type of instruction for decompression by a decompression engine 112 within a data decompression system 114. Decompressed data 116 generated by the decompression engine 112 may be provided to a processor 118 or a main memory 120. Non-limiting examples of instruction types include raw data instructions configured to provide a raw data stream to an output 122 and dictionary instructions configured to retrieve data from a dictionary 124 and provide corresponding data to the output 122. Another type of instruction includes lookback instructions configured to provide data from a lookback pre-fetch buffer 126 to the decompression engine 112. As discussed in more detail below, the data provided from the lookback pre-fetch buffer 126 has been pre-fetched from a lookback buffer 128 to reduce decompression latency. Further, the data decompression system 114 also includes a small input buffer 130 that buffers data to be provided to the decompression engine 112 and a small output buffer 132 that buffers data provided from the decompression engine 112 to the output 122.

With continuing reference to FIG. 1, during generation of the compressed data stream 104, the compression engine 110 is configured to determine if a current data block in the uncompressed data stream 108 was previously compressed by the compression engine 110. If the current data block was previously compressed, the compression engine 110 is configured to insert a lookback instruction corresponding to the current data block into the compressed data stream 104. The lookback instruction includes a lookback buffer index in this example that points to an entry in the lookback buffer 128 where the decompressed data 116 to be provided to the output 122 during decompression of the lookback instruction will be stored during decompression. Once the compressed data stream 104 has been generated, the compression engine 110 is configured to move (e.g., shift or copy) a lookback buffer index for each lookback instruction in the compressed data stream 104 to a corresponding lookback pre-fetch instruction in the compressed data stream 104. In this manner, once the compressed data stream 104 is generated, the compression engine 110 is configured to create a lookback pre-fetch instruction for each lookback instruction in the compressed data stream 104, and move each lookback buffer index to a corresponding lookback pre-fetch instruction.

In other words, each lookback instruction in the compressed data stream 104 includes a lookback buffer index that points to an entry in the lookback buffer 128 where decompressed data 116 corresponding to the data block will be stored during a separate decompression scheme. When the compressed data stream 104 has been created, the data compression system 102 is configured to move a lookback buffer index of each lookback instruction in the compressed data stream 104 into a lookback pre-fetch instruction located earlier than the corresponding lookback instruction in the sequence of instructions of the compressed data stream 104. Thus, each lookback pre-fetch instruction is scheduled to be accessed before the corresponding lookback instruction is decompressed. Moving each lookback buffer index earlier in the compressed data stream 104 to a lookback pre-fetch instruction to allow for pre-fetching of previously decompressed data 116 allows data for each lookback instruction to be pre-fetched prior to accessing the lookback instruction during decompression.

In this regard, FIG. 2 shows an example of the compressed data stream 104 before moving or shifting the lookback buffer indices in FIG. 2 to create a lookback pre-fetch instruction. In this manner, an instruction Decode 0 and an instruction Decode 1 in the compressed data stream 104 are each a raw data instruction (Raw Code) with 32 bits of data. In this example, the compression engine 110 generates the compressed data stream 104 with the instructions Decode 0 and Decode 1 by being configured to determine if data blocks in the uncompressed data stream 108 correspond to raw data instructions. In response to determining that some data blocks correspond to a raw data instruction, the compression engine 110 encodes the corresponding data blocks into the raw data instructions Decode 0 and Decode 1. Because the instructions Decode 0 and Decode 1 are not lookback instructions, no lookback buffer indices are moved. Similarly, an instruction Decode 2 is a dictionary instruction (Dictionary Code) with a corresponding dictionary index (Dict Index0). Notably, in this example, the compression engine 110 generates the compressed data stream 104 with the instruction Decode 2 by being configured to determine if data blocks in the uncompressed data stream 108 correspond to dictionary instructions. In response to determining that a data block corresponds to a dictionary instruction, the compression engine 110 encodes the corresponding data block into the dictionary instruction Decode 2. Because the instruction Decode 2 is not a lookback instruction, no lookback buffer indices are moved. However, an instruction Decode 3 is a lookback instruction (Lookback Code) with a corresponding lookback buffer index (LB Index0).

In this regard, because the instruction Decode 3 is a lookback instruction, the compression engine 110 is configured to move the lookback buffer index (LB Index0) to a lookback pre-fetch instruction created in the compressed data stream 104 that is scheduled to be accessed prior to the instruction Decode 3 being accessed during decompression. In this example, because the instruction Decode 3 is the first lookback instruction in the compressed data stream 104, the compression engine 110 is configured to move the lookback buffer index (LB Index0) to a corresponding lookback pre-fetch instruction (Pre-fetch LB Index0) in the compressed data stream 104. Notably, the lookback pre-fetch instruction (Pre-fetch LB Index0) is positioned in the compressed data stream 104 such that the lookback pre-fetch instruction (Pre-fetch LB Index0) is scheduled to be accessed prior to the instruction Decode 0 during decompression, wherein the instruction Decode 0 is the first instruction in the compressed data stream 104. In this manner, moving the lookback buffer index (LB Index0) to the lookback pre-fetch instruction (Pre-fetch LB Index0) will result in the data stored at (LB Index0) in the lookback buffer 128 being retrieved and stored in the lookback pre-fetch buffer 126 during decompression prior to accessing the instruction Decode 3. Thus, the data at (LB Index0) is pre-fetched prior to being accessed by the lookback instruction corresponding to the instruction Decode 3.

Similarly, instructions Decode m+1, Decode m+2 are also lookback instructions. However, unlike the lookback buffer index (LB Index0) above, the lookback buffer index (LB Index1) corresponding to the instruction Decode m+1 and the lookback buffer index (LB Index2) corresponding to the instruction Decode m+2 are each moved into a lookback pre-fetch instruction that is scheduled to be accessed with a closest previous lookback instruction during decompression. Thus, the lookback buffer index (LB Index1) of the instruction Decode m+1 is moved to a lookback pre-fetch instruction (Pre-fetch LB Index1) corresponding to the instruction Decode 3. Further, the lookback buffer index (LB Index2) of the instruction Decode m+2 is moved to a lookback pre-fetch instruction (Pre-fetch LB Index2) corresponding to the instruction Decode m+1. Additionally, since no lookback instruction exists in the compressed data stream 104 after the instruction Decode m+2, the compression engine 110 is configured to add a dummy lookback pre-fetch instruction (Pre-fetch LB Index3) to the last lookback instruction Decode m+2 so as to maintain consistency among each lookback instruction in the compressed data stream 104.

With continuing reference to FIGS. 1 and 2, moving the lookback buffer indices as illustrated in the compressed data stream 104 after compression allows the decompression engine 112 to retrieve data for the instructions Decode 3, Decode m+1, and Decode m+2 (i.e., the lookback instructions Decode 3, Decode m+1, and Decode m+2) from the lookback pre-fetch buffer 126 rather than retrieving the data from the lookback buffer 128. For example, when decompressing the instruction Decode 3, the data to be decompressed and provided to the output 122 is pre-fetched and stored during the lookback pre-fetch instruction (Pre-fetch LB Index0). Thus, the data stored at (LB Index0) of the lookback buffer 128 is already stored in the lookback pre-fetch buffer 126 during decompression of the instruction Decode 3. Similarly, the data stored in the lookback buffer 128 at (LB Index1) and (LB Index2) are already stored in the lookback pre-fetch buffer 126 during decompression of the instructions Decode m+1 and Decode m+2, respectively. Thus, the data corresponding to the instructions Decode 3, Decode m+1, and Decode m+2 may be retrieved more quickly from the lookback pre-fetch buffer 126 by the decompression engine 112 as compared to retrieving the data from the lookback buffer 128. Notably, the lookback pre-fetch buffer 126 is employed in higher level memory while the lookback buffer 128 is employed in a main memory 120, which is lower level memory. Thus, retrieving the data from the lookback pre-fetch buffer 126 has lower access latency as compared to retrieving the data from the lookback buffer 128.

In other words, moving each lookback buffer index (LB Index0), (LB Index 1), and (LB Index2) in this manner allows data for the lookback instructions Decode 3, Decode m+1, and Decode m+2 to be pre-fetched prior to being requested during decompression. Pre-fetching the data allows the lookback buffer 128 to be employed in lower level memory such as the main memory 120 rather than higher level memory, because pre-fetching the data mitigates the higher access latency of lower level memory. Further, the lookback pre-fetch buffer 126 in this example has a smaller area than the lookback buffer 128. Thus, pre-fetching data corresponding to the lookback instructions Decode 3, Decode m+1, and Decode m+2 allows for the reduced decompression time and reduced compressed data stream size of lookback-based compression while avoiding or reducing chip area penalty of the data decompression system 114 caused by the lookback buffer 128.

Notably, although the aspects described herein include the lookback buffer 128 employed in the main memory 120 (e.g., lower level memory), the data compression system 102 may also be employed in processing systems that include the lookback buffer 128 in other levels of memory, such as, but not limited to, higher level memory located in the data decompression system 114.

Figure 3:
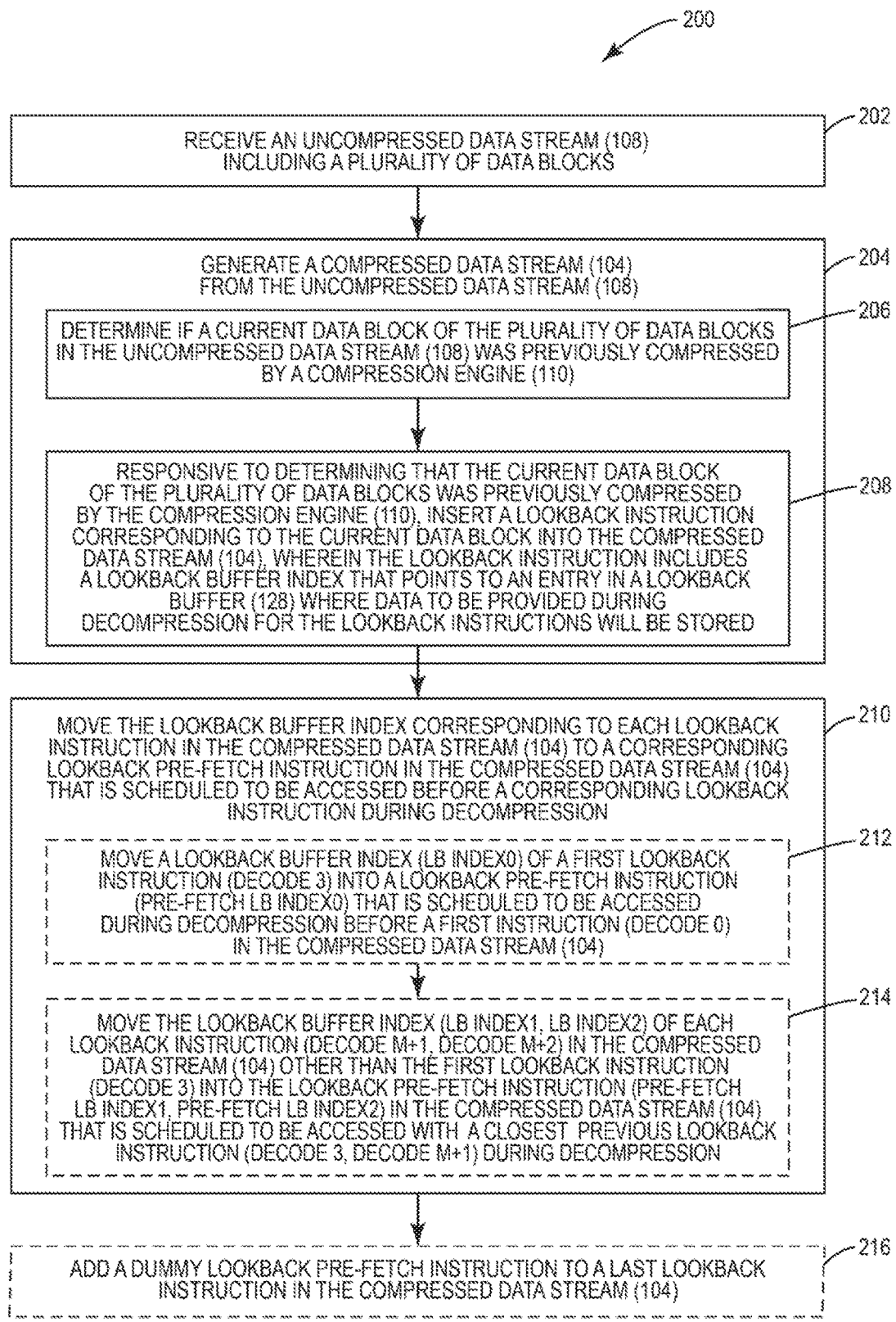
FIG. 3 is a flowchart illustrating an exemplary process for generating the compressed data stream with the lookback pre-fetch instructions in FIG. 2.

Additionally, FIG. 3 illustrates an exemplary process 200 that the data compression system 102 in FIG. 1 may employ to generate the compressed data stream 104 with the lookback pre-fetch instructions in FIG. 2. The process 200 includes the data stream input circuit 106 receiving the uncompressed data stream 108 (block 202). The process 200 further includes the compression engine 110 generating the compressed data stream 104 from the uncompressed data stream 108 (block 204). To generate the compressed data stream 104 in block 204, the process 200 includes the compression engine 110 determining if a current data block was previously compressed by the compression engine 110 for each data block (block 206). Responsive to determining that the current data block was previously compressed by the compression engine 110 in block 206, the process 200 includes the compression engine 110 inserting a lookback instruction corresponding to the current data block into the compressed data stream 104 (block 208). As previously described, the lookback instruction includes a lookback buffer index that points to an entry in the lookback buffer 128 where data to be provided during decompression of the lookback instructions will be stored.

With continuing reference to FIG. 3, the process 200 includes the compression engine 110 moving the lookback buffer index corresponding to each lookback instruction in the compressed data stream 104 to a corresponding lookback pre-fetch instruction in the compressed data stream 104 that is scheduled to be accessed before the corresponding lookback instruction during decompression (block 210). One way to perform the moving in block 210 includes moving a lookback buffer index (LB Index0) of a first lookback instruction Decode 3 into the lookback pre-fetch instruction (Pre-fetch LB Index0) that is scheduled to be accessed during decompression before the first instruction Decode 0 in the compressed data stream 104 (block 212). Further, the moving in block 210 may also include moving the lookback buffer index (LB Index1), (LB Index 2) of each lookback instruction Decode m+1, Decode m+2 in the compressed data stream 104 other than the first lookback instruction Decode 3 into a lookback pre-fetch instruction (Pre-fetch LB Index1, Pre-fetch LB Index2) in the compressed data stream 104 that is scheduled to be accessed with a closest previous lookback instruction Decode 3, Decode m+1 during decompression (block 214).

With continuing reference to FIG. 3, the process 200 may include the compression engine 110 adding the dummy lookback pre-fetch instruction (Pre-fetch LB Index3) to the last lookback instruction Decode m+2 in the compressed data stream 104 (block 216). In this manner, pre-fetching data corresponding to the lookback instructions Decode 3, Decode m+1, and Decode m+2 using the process 200 allows for the reduced decompression time and reduced compressed data stream size of lookback-based compression while avoiding or reducing chip area penalty of the data decompression system 114 caused by the lookback buffer 128.

To illustrate more clearly the advantages offered by the aspects described above that include lookback pre-fetching, FIG. 4 illustrates a processing system 300 that does not include lookback pre-fetch instructions. FIG. 5 illustrates a compressed data stream 302 generated and used within the processing system 300, which will be described in conjunction with FIG. 4. Notably, the compressed data stream 302 is similar to the compressed data stream 104 before moving the lookback buffer indices in FIG. 2.

In this regard, the processing system 300 includes a data compression system 304 with a data stream input circuit 306 that receives an uncompressed data stream 308. A compression engine 310 receives the uncompressed data stream 308 from the data stream input circuit 306 and generates the compressed data stream 302. The compressed data stream 302 is provided to a processor 312 and then to a data decompression system 314. Small input and output buffers 316, 318 similar to the small input and output buffers 130, 132 in FIG. 1 are employed in the data decompression system 314. Further, a dictionary 320 is employed in the data decompression system 314 similar to the dictionary 124 in FIG. 1.

Figure 4:
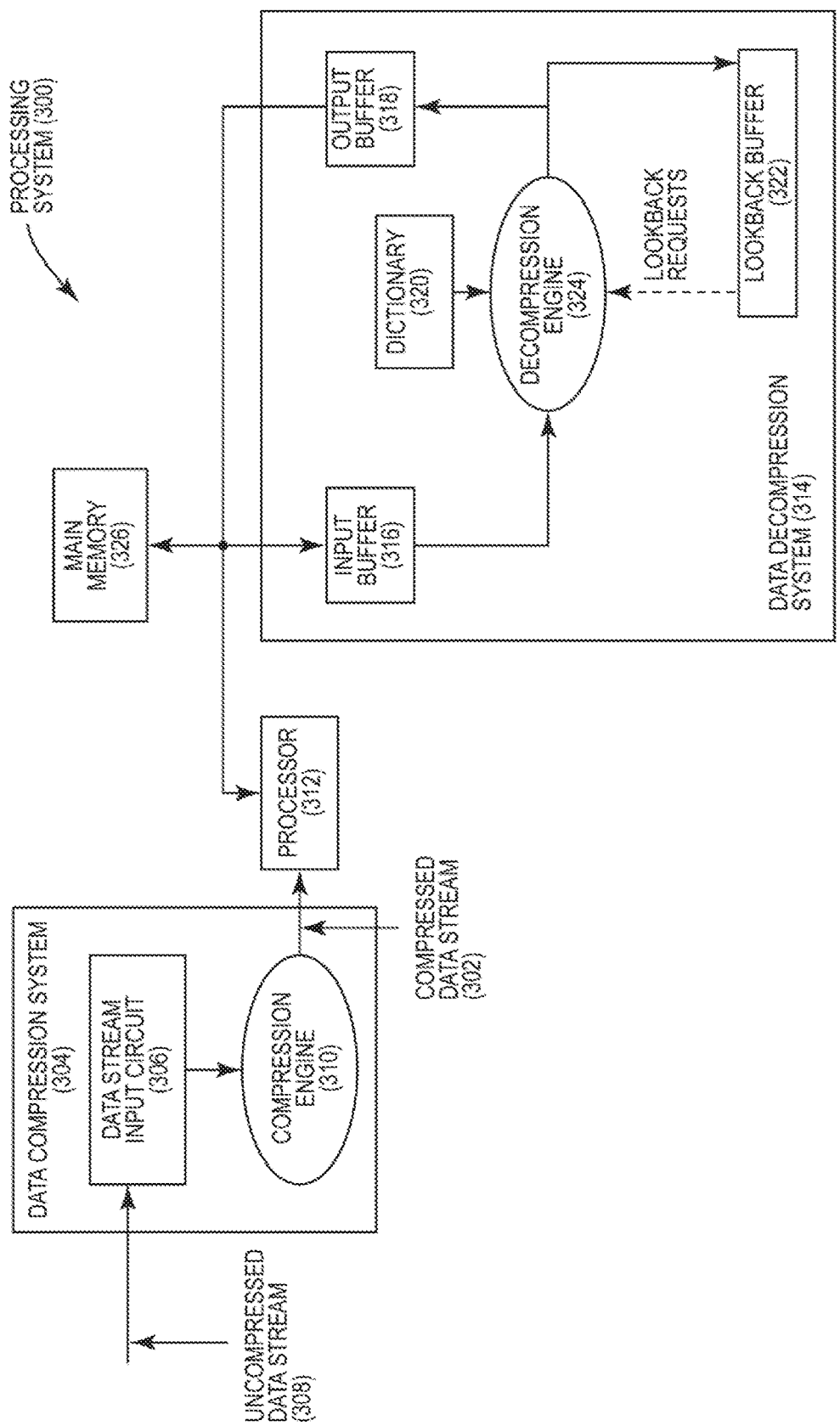
FIG. 4 is a block diagram of an exemplary processing system with a data compression system that employs lookback-based compression using a conventional lookback buffer.
Figure 5:
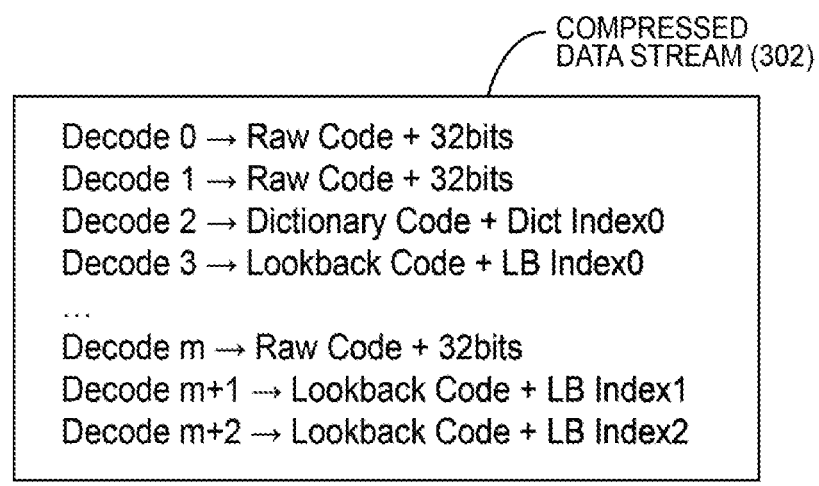
FIG. 5 is a diagram of an exemplary compressed data stream generated by the data compression system in the processing system in FIG. 4.

With continuing reference to FIGS. 4 and 5, unlike the compression engine 110 in FIG. 1, the compression engine 310 does not move the lookback buffer indices corresponding to the lookback instructions Decode 3, Decode m+1, and Decode m+2. Thus, data corresponding to the lookback instructions Decode 3, Decode m+1, and Decode m+2 is retrieved from a lookback buffer 322 during decompression of each lookback instruction Decode 3, Decode m+1, and Decode m+2. Importantly, the lookback buffer 322 is employed in higher level memory in the data decompression system 314, as opposed to lower level memory like the main memory 120 in FIG. 1. In this manner, data may be retrieved from the lookback buffer 322 by a decompression engine 324 with a reduced access latency of higher level memory. However, because the lookback buffer 322 is employed in higher level memory within the data decompression system 314, the lookback buffer 322 adds to the chip area penalty of the data decompression system 314, as opposed to being employed in lower level memory such as a main memory 326. In contrast, by implementing the lookback pre-fetch instructions described in relation to the processing system 100 in FIG. 1, the lookback buffer 128 may be employed in the main memory 120 (e.g., a lower level memory with a higher access latency) in FIG. 1. Thus, the processing system 100 in FIG. 1 may enjoy the reduced decompression time and reduced compressed data stream size of lookback-based compression while avoiding or reducing chip area penalty of the data decompression system 114 caused by the lookback buffer 128 in FIG. 1.

Figure 6:
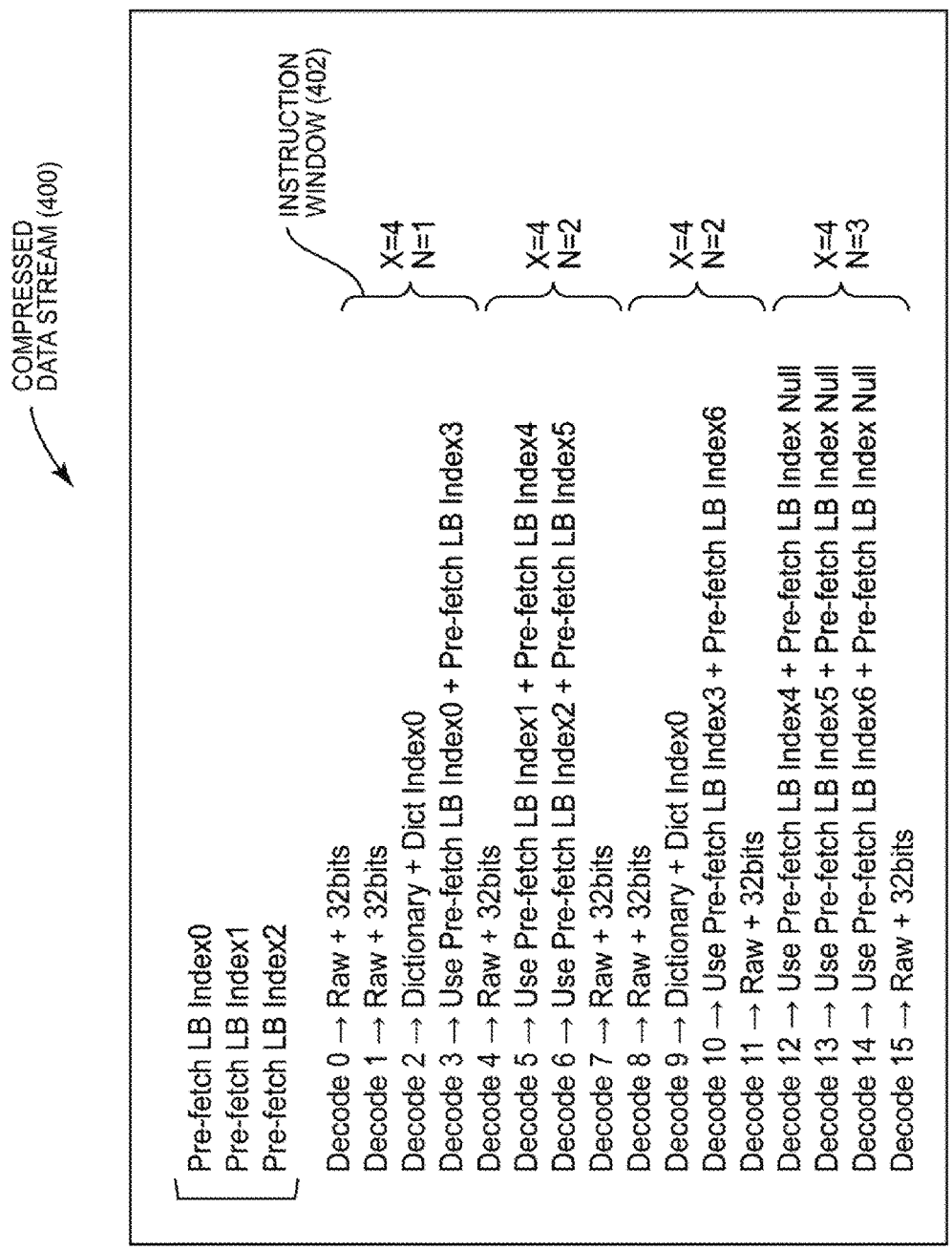
FIG. 6 is a diagram of an exemplary compressed data stream having more than one lookback buffer index moved to a lookback pre-fetch instruction prior to a first instruction in the compressed data stream.

In addition to moving the lookback buffer indices in the compressed data stream 104 as described with relation FIGS. 1-3 above, other aspects may move more than one lookback buffer index to corresponding lookback pre-fetch instructions prior to the first instruction to achieve additional advantages. In this regard, FIG. 6 illustrates a compressed data stream 400 with more than one lookback buffer index moved to a lookback pre-fetch instruction prior to a first instruction Decode 0 in the compressed data stream 400. To move the lookback buffer indices in this manner, the compression engine 110 in FIG. 1 is configured to determine a maximum number of lookback instructions N in the compressed data stream 400 within an instruction window 402 of size X. In other words, the instruction window 402 encompasses an X number of instructions in the compressed data stream 400. One way to determine the size X of the instruction window 402 is to set the size X according to a worst-case round-trip access time to the main memory 120 in FIG. 1. In this example, the size X is set to four (4) because the worst-case round-trip access time to the main memory 120 in FIG. 1 is approximately equal to the time in which the decompression engine 112 decompresses four (4) instructions in the compressed data stream 400.

In this regard, the compression engine 110 is configured to analyze the first four (4) instructions in the compressed data stream 400 that are within the instruction window 402, instructions Decode 0-Decode 3. Because the instructions Decode 0-Decode 3 include one (1) lookback instruction (instruction Decode 3), the maximum number of lookback instructions N is set to one (1). The compression engine 110 in FIG. 1 is further configured to slide the instruction window 402 over the next four (4) instructions in the compressed data stream 400 (instructions Decode 4-Decode 7). Because the instructions Decode 4-Decode 7 include two (2) lookback instructions (instructions Decode 5, Decode 6), the maximum number of lookback instructions N is set to two (2). The compression engine 110 in FIG. 1 is further configured to slide the instruction window 402 over the next four (4) instructions in compressed data stream 400 (instructions Decode 8-Decode 11). However, because the instructions Decode 8-Decode 11 include one (1) lookback instruction (instruction Decode 10), the maximum number of lookback instructions N keeps a value of two (2) from the previous step. Further, the compression engine 110 in FIG. 1 is configured to slide the instruction window 402 over the last four (4) instructions in compressed data stream 400 (instructions Decode 12-Decode 15). Because the instructions Decode 12-Decode 15 include three (3) lookback instructions (instructions Decode 12, Decode 13, Decode 14), the maximum number of lookback instructions N is set to three (3).

In this regard, because the compression engine 110 analyzed the compressed data stream 400 using the instruction window 402 to determine that the maximum number of lookback instructions N equals three (3), the lookback buffer indices corresponding to the first three lookback instructions in the compressed data stream 400 are moved to lookback pre-fetch instructions prior to the first instruction Decode 0. Thus, as illustrated in FIG. 6, the lookback indices (LB Index0, LB Index1, and LB Index2) corresponding to the instructions Decode 3, Decode 5, and Decode 6, respectively, are moved to lookback pre-fetch instructions (Pre-fetch LB Index0, Pre-fetch LB Index1, Pre-fetch LB Index2) prior to the instruction Decode 0. Further, the compression engine 110 is configured to move the lookback buffer indices corresponding to the remaining lookback instructions Decode 10, Decode 12, Decode 13, and Decode 14 to lookback pre-fetch instructions corresponding to the lookback instructions located the maximum number of lookback instructions N (e.g., 3) from each remaining lookback instruction. Thus, the lookback buffer index (LB Index3) of the instruction Decode 10 is moved to the lookback pre-fetch instruction (Pre-fetch LB Index3) with the instruction Decode 3. The lookback buffer index (LB Index4) of the instruction Decode 12 is moved to the lookback pre-fetch instruction (Pre-fetch LB Index4) with the instruction Decode 5. The lookback buffer index (LB Index5) of the instruction Decode 13 is moved to the lookback pre-fetch instruction (Pre-fetch LB Index 5) with the instruction Decode 6. Further, the lookback buffer index (LB Index6) of the instruction Decode 14 is moved to the lookback pre-fetch instruction (Pre-fetch LB Index 6) with the instruction Decode 10. Additionally, because the maximum number of lookback instructions N equals three (3), dummy lookback pre-fetch instructions (Pre-fetch LB Index Null) are placed in the last three (3) lookback instructions Decode 12-Decode 14. By moving the lookback buffer indices in the compressed data stream 400 in this manner, the data corresponding to each lookback instruction may be pre-fetched so that the data is available for retrieval from the lookback pre-fetch buffer 126 in FIG. 1 even in instances of worst-case access times to the lookback buffer 128 in FIG. 1.

Figure 7:
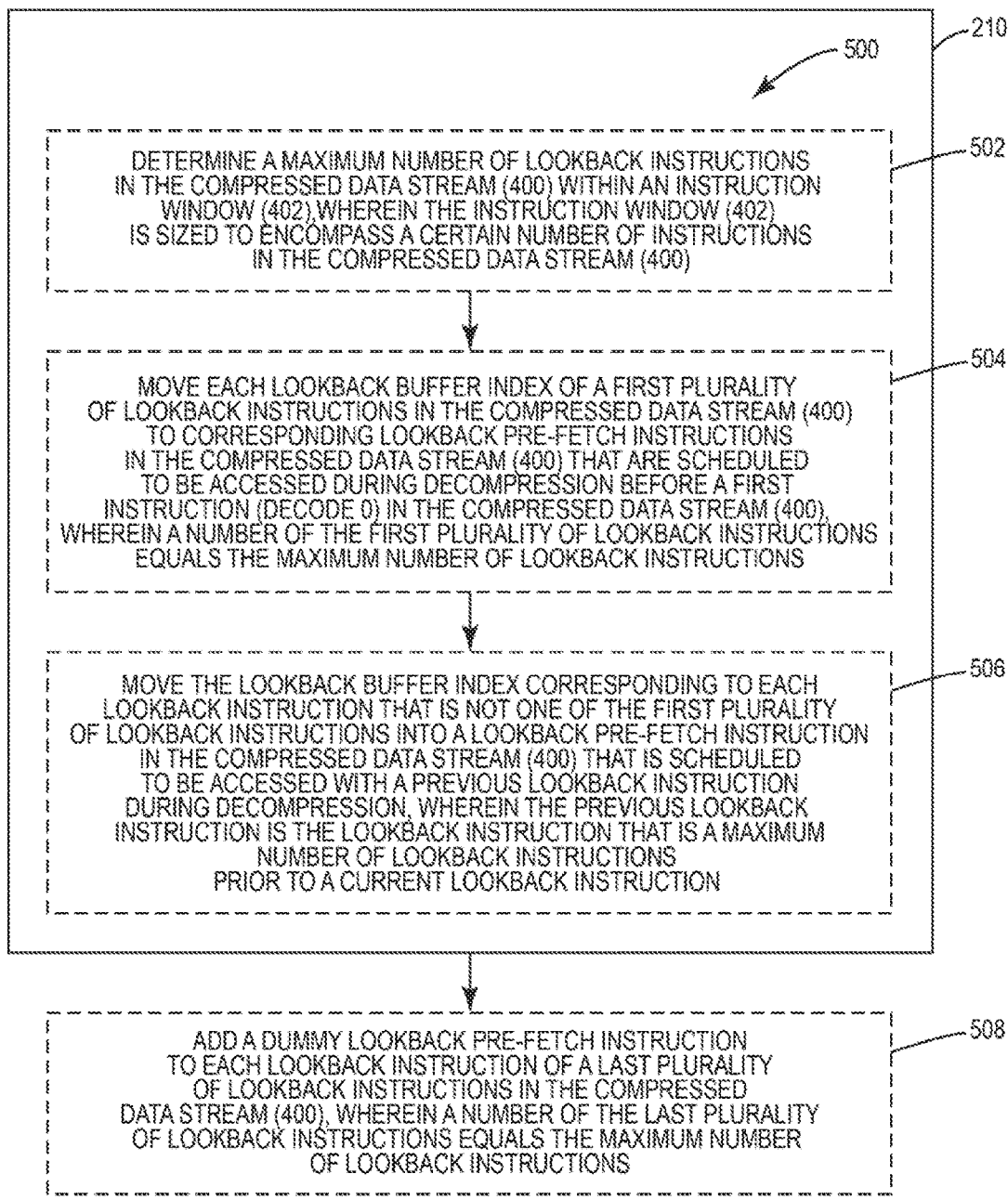
FIG. 7 is a flowchart of an exemplary process for moving more than one lookback buffer index in the compressed data stream in FIG. 6 to a lookback pre-fetch instruction prior to the first instruction in the compressed data stream.

In this regard, FIG. 7 illustrates an exemplary process 500 used by the compression engine 110 in FIG. 1 to move more than one lookback buffer index in the compressed data stream 400 in FIG. 6 to a lookback pre-fetch instruction prior to the first instruction Decode 0. In this manner, the process 500 may be used to achieve the moving of lookback buffer indices in block 210 in FIG. 3. The process 500 includes determining the maximum number of lookback instructions N in the compressed data stream 400 within the instruction window 402 of size X (block 502). The process 500 also includes moving each lookback buffer index of the first lookback instructions in the compressed data stream 400 to corresponding lookback pre-fetch instructions in the compressed data stream 400 that are scheduled to be accessed during decompression before the first instruction Decode 0 (block 504). As described above, the number of first lookback instructions with lookback buffer indices moved equals the maximum number of lookback instructions N. Further, the process 500 includes moving the lookback buffer index corresponding to each lookback instruction that is not one of the first lookback instructions into a lookback pre-fetch instruction in the compressed data stream 400 that is scheduled to be accessed with a previous lookback instruction during decompression (block 506). The previous lookback instruction is the lookback instruction that is a maximum number of lookback instructions N prior to a current lookback instruction. Further, the process 500 includes adding a dummy lookback pre-fetch instruction to each lookback instruction of a last plurality of lookback instructions in the compressed data stream 400, wherein a number of the last plurality of lookback instructions equals the maximum number of lookback instructions N (block 508). By employing the process 500, the compression engine 110 in FIG. 1 is configured to generate the compressed data stream 400 in FIG. 6 as described above.

Additionally, as previously described in relation to FIGS. 1-3, data for a lookback instruction in the compressed data stream 104 is pre-fetched from the lookback buffer 128 and stored in the lookback pre-fetch buffer 126 in FIG. 1 prior to the decompression engine 112 decompressing the corresponding lookback instruction. However, data that is pre-fetched from the lookback buffer 128 may not be valid data due to delays in writing decompressed data 116 from the decompression engine 112 to the lookback buffer 128. For example, once the decompression engine 112 successfully decompresses an instruction in the compressed data stream 104, the compression engine 110 provides the decompressed data 116 to the small output buffer 132. The small output buffer 132 provides the decompressed data 116 to the output 122 to be written to the lookback buffer 128 in the main memory 120. In this manner, there is a delay from the time in which the decompression engine 112 generates the decompressed data 116 to the time in which the decompressed data 116 is stored in the lookback buffer 128. In some circumstances, the decompression engine 112 may execute a lookback pre-fetch instruction to the lookback buffer 128 before the decompressed data 116 requested by the lookback pre-fetch instruction has been written to the lookback buffer 128. Thus, the lookback pre-fetch instruction may cause invalid data to be retrieved from the lookback buffer 128 and stored in the lookback pre-fetch buffer 126.

Figure 8:
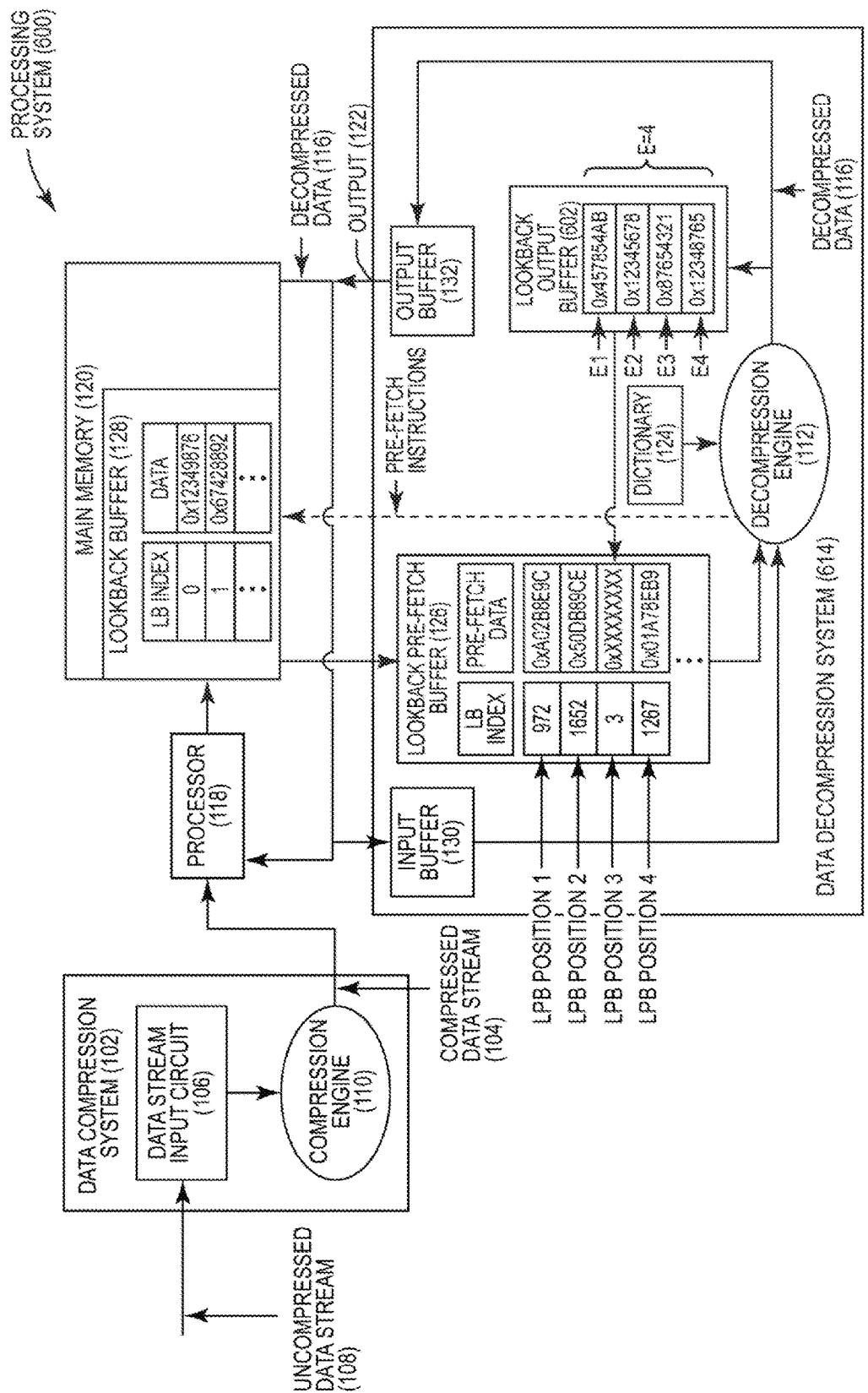
FIG. 8 is a block diagram of an exemplary processing system employing lookback pre-fetch instructions that include a lookback output buffer configured to store decompressed data that may not yet be stored in a lookback pre-fetch buffer.

In this regard, with reference to FIG. 8, an exemplary processing system 600 is provided that is similar to the processing system 100 in FIG. 1. However, the processing system 600 employs a lookback output buffer 602 to reduce or avoid retrieving invalid data from the lookback pre-fetch buffer 126. In this example, the lookback pre-fetch buffer 126 and the lookback output buffer 602 are both configured to use a first-in, first-out (FIFO) buffering scheme. The lookback output buffer 602 is employed in a data decompression system 614 and is configured to store decompressed data 116 recently decompressed by the decompression engine 112. The lookback output buffer 602 is designed with a number of entries E according to a worst-case round-trip access time to the main memory 120 in FIG. 8. In this example, the number of entries E is set to four (4) because the worst-case round-trip access time to the main memory 120 in FIG. 1 is approximately equal to the time in which the decompression engine 112 decompresses four (4) instructions.

In this manner, in response to the decompression engine 112 decompressing a lookback instruction, the decompression engine 112 references the lookback pre-fetch buffer 126. If a lookback pre-fetch buffer position (LPB Position) of the most recently stored data block in the lookback pre-fetch buffer 126 minus the lookback pre-fetch buffer position (LPB Position) of the data block requested by the lookback pre-fetch instruction is less than the number of entries E in the lookback output buffer 602, the decompressed data block is provided from the lookback output buffer 602 to the output 122. On the other hand, if the lookback pre-fetch buffer position (LPB Position) of the most recently stored data block in the lookback pre-fetch buffer 126 minus the lookback pre-fetch buffer position (LPB Position) of the data block requested by the lookback pre-fetch instruction is greater than the number of entries E, the decompressed data block is provided from the lookback pre-fetch buffer 126.

For example, with continuing reference to FIG. 8, the lookback output buffer 602 has four (4) entries, while the lookback pre-fetch buffer position (LPB Position) of the most recently stored data block in the lookback pre-fetch buffer 126 is four (LPB Position 4, Pre-fetch Data 0x01A78EB9), and the lookback pre-fetch buffer position (LPB Position) of the data block requested by the lookback pre-fetch instruction is three (LPB Position 3, Pre-fetch Data 0xXXXXXXXX). Thus, the (LPB Position 4) minus the (LPB Position 3) is equal to one (1) (4−3=1). Because lookback output buffer 602 has four (4) entries E, the requested decompressed data 116 is provided to the output 122 from the lookback output buffer 602 (from E1, Data 0x457854AB). In this manner, the processing system 600 may reduce or avoid providing invalid decompressed data 116 from the lookback pre-fetch buffer 126 to the output 122.

Further, the elements described herein are sometimes referred to as means for performing particular functions. In this regard, the data stream input circuit 106 is sometimes referred to herein as a means for receiving the uncompressed data stream 108. The compression engine 110 is sometimes referred to herein as a means for generating the compressed data stream 104 from the uncompressed data stream 108. The compression engine 110 may be a means for generating the compressed data stream 104 by being a means for determining if a current data block of a plurality of data blocks in the uncompressed data stream 108 was previously compressed by the means for generating the compressed data stream 104. The compression engine 110 may also be a means for generating the compressed data stream 104 by being a means for inserting a lookback instruction corresponding to the current data block into the compressed data stream 104 in response to determining that the current data block of the plurality of data blocks was previously compressed by the means for generating the compressed data stream 104. Further, the compression engine 110 is also sometimes referred to herein as a means for moving the lookback buffer index corresponding to each lookback instruction in the compressed data stream 104 to a corresponding lookback pre-fetch instruction in the compressed data stream 104 that is scheduled to be accessed before a corresponding lookback instruction during decompression.

Generating compressed data streams with lookback pre-fetch instructions for pre-fetching decompressed data from a lookback buffer according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 9:
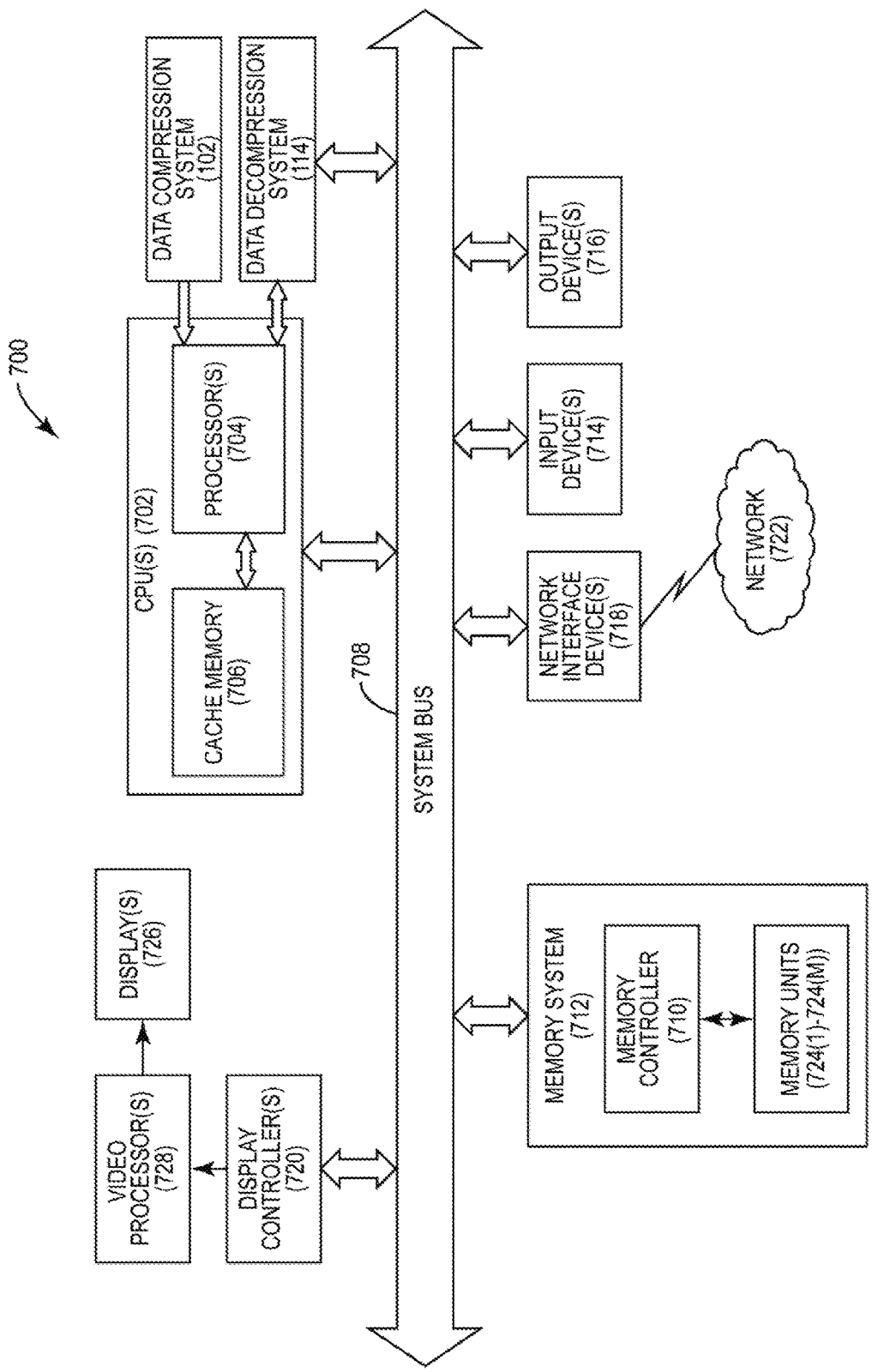
FIG. 9 is a block diagram of an exemplary processor-based system that can include the data compression system of FIG. 1.

In this regard, FIG. 9 illustrates an example of a processor-based system 700 that may employ the data compression system 102 and the data decompression system 114 illustrated in FIG. 1. Further, although not illustrated, the processor-based system 700 may employ the data decompression system 614 in FIG. 8 in place of the data decompression system 114. In this example, the processor-based system 700 includes one or more central processing units (CPUs) 702, each including one or more processors 704. As illustrated in FIG. 9, the processors 704 communicate with the data compression system 102 and the data decompression system 114. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 9, multiple system buses 708 could be provided, wherein each system bus 708 constitutes a different fabric.

Other master and slave devices can be connected to the system bus 708. As illustrated in FIG. 9, these devices can include a memory system 712, one or more input devices 714, one or more output devices 716, one or more network interface devices 718, and one or more display controllers 720, as examples. The input device(s) 714 can include any type of input device, including but not limited to input keys, switches, voice processors, etc. The output device(s) 716 can include any type of output device, including but not limited to audio, video, other visual indicators, etc. The network interface device(s) 718 can be any device configured to allow exchange of data to and from a network 722. The network 722 can be any type of network, including but not limited to a wired or wireless network, a private or public network, a local area network (LAN), a wireless local area network (WLAN), a wide area network (WAN), a BLUETOOTH™ network, or the Internet. The network interface device(s) 718 can be configured to support any type of communications protocol desired. The memory system 712 can include one or more memory units 724(1)-724(M).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A data compression system, comprising:
    a data stream input circuit configured to receive an uncompressed data stream comprising a plurality of data blocks; and
    a compression engine configured to:
        generate a compressed data stream from the uncompressed data stream by being configured to:
            determine if a current data block of the plurality of data blocks in the uncompressed data stream was previously compressed by the compression engine; and
            responsive to determining that the current data block of the plurality of data blocks was previously compressed by the compression engine, insert a lookback instruction corresponding to the current data block into the compressed data stream, wherein the lookback instruction comprises a lookback buffer index that points to an entry in a lookback buffer that stores data to be provided during decompression of the lookback instruction; and
        move the lookback buffer index corresponding to each lookback instruction in the compressed data stream to a corresponding lookback pre-fetch instruction in the compressed data stream that is scheduled to be accessed before a corresponding lookback instruction during decompression by being configured to:
            create a corresponding lookback pre-fetch instruction for each corresponding lookback buffer index in the compressed data stream; and
            move each corresponding lookback buffer index to the corresponding lookback pre-fetch instruction in the compressed data stream.

2. The data compression system of claim 1, wherein the compression engine is further configured to move the lookback buffer index by being configured to move a lookback buffer index of a first lookback instruction into a lookback pre-fetch instruction in the compressed data stream that is scheduled to be accessed during decompression before a first instruction in the compressed data stream.

3. The data compression system of claim 2, wherein the compression engine is further configured to move the lookback buffer index by being configured to move the lookback buffer index of each lookback instruction in the compressed data stream other than the first lookback instruction into a lookback pre-fetch instruction in the compressed data stream that is scheduled to be accessed with a closest previous lookback instruction during decompression.

4. The data compression system of claim 3, wherein the compression engine is further configured to add a dummy lookback pre-fetch instruction to a last lookback instruction in the compressed data stream.

5. The data compression system of claim 1, wherein the compression engine is further configured to move the lookback buffer index corresponding to each lookback instruction by being configured to:
    determine a maximum number of lookback instructions in the compressed data stream within an instruction window, wherein the instruction window is sized to encompass a certain number of instructions in the compressed data stream; and
    move each lookback buffer index of a first plurality of lookback instructions in the compressed data stream to corresponding lookback pre-fetch instructions in the compressed data stream that are scheduled to be accessed during decompression before a first instruction in the compressed data stream, wherein a number of the first plurality of lookback instructions equals the maximum number of lookback instructions.

6. The data compression system of claim 5, wherein the compression engine is further configured to move the lookback buffer index by being configured to:
    move the lookback buffer index corresponding to each lookback instruction that is not one of the first plurality of lookback instructions into a lookback pre-fetch instruction in the compressed data stream that is scheduled to be accessed with a previous lookback instruction during decompression,
    wherein the previous lookback instruction is the lookback instruction that is the maximum number of lookback instructions prior to a current lookback instruction.

7. The data compression system of claim 6, wherein the compression engine is further configured to add a dummy lookback pre-fetch instruction to each lookback instruction of a last plurality of lookback instructions in the compressed data stream, wherein a number of the last plurality of lookback instructions equals the maximum number of lookback instructions.

8. The data compression system of claim 1, wherein the compression engine is configured to generate the compressed data stream by being further configured to:
 determine if the current data block of the plurality of data blocks corresponds to a dictionary instruction; and
 responsive to determining that the current data block of the plurality of data blocks corresponds to a dictionary instruction, encode the current data block into a dictionary instruction in the compressed data stream.

9. The data compression system of claim 1, wherein the compression engine is configured to generate the compressed data stream by being further configured to:
 determine if the current data block of the plurality of data blocks corresponds to a raw data instruction; and
 responsive to determining that the current data block of the plurality of data blocks corresponds to a raw data instruction, encode the current data block into a raw data instruction in the compressed data stream.

10. The data compression system of claim 1 integrated into an integrated circuit (IC).

11. The data compression system of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

12. A method for generating a compressed data stream with lookback pre-fetch instructions, comprising:
 receiving an uncompressed data stream comprising a plurality of data blocks;
 generating a compressed data stream from the uncompressed data stream, wherein generating comprises:
  determining if a current data block of the plurality of data blocks in the uncompressed data stream was previously compressed by a compression engine; and
  responsive to determining that the current data block of the plurality of data blocks was previously compressed by the compression engine, inserting a lookback instruction corresponding to the current data block into the compressed data stream, wherein the lookback instruction comprises a lookback buffer index that points to an entry in a lookback buffer that stores data to be provided during decompression of the lookback instruction; and
 moving the lookback buffer index corresponding to each lookback instruction in the compressed data stream to a corresponding lookback pre-fetch instruction in the compressed data stream that is scheduled to be accessed before a corresponding lookback instruction during decompression, wherein moving the lookback buffer index comprises:
  creating a corresponding lookback pre-fetch instruction for each corresponding lookback buffer index in the compressed data stream; and
  moving each corresponding lookback buffer index to the corresponding lookback pre-fetch instruction in the compressed data stream.

13. The method of claim 12, wherein moving the lookback buffer index corresponding to each lookback instruction further comprises moving a lookback buffer index of a first lookback instruction into a lookback pre-fetch instruction in the compressed data stream that is scheduled to be accessed during decompression before a first instruction in the compressed data stream.

14. The method of claim 13, wherein moving the lookback buffer index corresponding to each lookback instruction further comprises moving the lookback buffer index of each lookback instruction in the compressed data stream other than the first lookback instruction into a lookback pre-fetch instruction in the compressed data stream that is scheduled to be accessed with a closest previous lookback instruction during decompression.

15. The method of claim 14, further comprising adding a dummy lookback pre-fetch instruction to a last lookback instruction in the compressed data stream.

16. The method of claim 12, wherein moving the lookback buffer index corresponding to each lookback instruction comprises:
 determining a maximum number of lookback instructions in the compressed data stream within an instruction window, wherein the instruction window is sized to encompass a certain number of instructions in the compressed data stream; and
 moving each lookback buffer index of a first plurality of lookback instructions in the compressed data stream to corresponding lookback pre-fetch instructions in the compressed data stream that are scheduled to be accessed during decompression before a first instruction in the compressed data stream, wherein a number of the first plurality of lookback instructions equals the maximum number of lookback instructions.

17. The method of claim 16, wherein moving the lookback buffer index corresponding to each lookback instruction further comprises:
 moving the lookback buffer index corresponding to each lookback instruction that is not one of the first plurality of lookback instructions into a lookback pre-fetch instruction in the compressed data stream that is scheduled to be accessed with a previous lookback instruction during decompression,
 wherein the previous lookback instruction is the lookback instruction that is the maximum number of lookback instructions prior to a current lookback instruction.

18. The method of claim 17, further comprising adding a dummy lookback pre-fetch instruction to each lookback instruction of a last plurality of lookback instructions in the compressed data stream, wherein a number of the last plurality of lookback instructions equals the maximum number of lookback instructions.

19. A data compression system, comprising:
 a means for receiving an uncompressed data stream comprising a plurality of data blocks;
 a means for generating a compressed data stream from the uncompressed data stream, comprising;
  a means for determining if a current data block of the plurality of data blocks in the uncompressed data stream was previously compressed by the means for generating the compressed data stream; and
  responsive to determining that the current data block of the plurality of data blocks was previously compressed by the means for generating the compressed data stream, a means for inserting a lookback instruction corresponding to the current data block into the compressed data stream, wherein the lookback instruction comprises a lookback buffer index that points to an entry in a lookback buffer that stores data to be provided during decompression of the lookback instruction; and a means for moving the lookback buffer index corresponding to each lookback instruction in the compressed data stream to a corresponding lookback pre-fetch instruction in the compressed data stream that is scheduled to be accessed before a corresponding lookback instruction during decompression, wherein the means for moving the lookback buffer index comprises:

a means for creating a corresponding lookback pre-fetch instruction for each corresponding lookback buffer index in the compressed data stream; and a means for moving each corresponding lookback buffer index to the corresponding lookback pre-fetch instruction in the compressed data stream.

20. A processing system, comprising:
a processor;
a data decompression system configured to decompress a compressed data stream;
a lookback buffer comprised of lower level memory that is placed separately from the data decompression system; and
a data compression system, comprising:
a data stream input circuit configured to receive an uncompressed data stream comprising a plurality of data blocks; and
a compression engine configured to:
generate the compressed data stream from the uncompressed data stream by being configured to;
determine if a current data block of the plurality of data blocks in the uncompressed data stream was previously compressed by the compression engine; and
responsive to determining that the current data block of the plurality of data blocks was previously compressed by the compression engine, insert a lookback instruction corresponding to the current data block into the compressed data stream, wherein the lookback instruction comprises a lookback buffer index that points to an entry in the lookback buffer that stores data to be provided during decompression of the lookback instruction; and
move the lookback buffer index corresponding to each lookback instruction in the compressed data stream to a corresponding lookback pre-fetch instruction in the compressed data stream that is scheduled to be accessed before a corresponding lookback instruction during decompression by being configured to:
create a corresponding lookback pre-fetch instruction for each corresponding lookback buffer index in the compressed data stream; and
move each corresponding lookback buffer index to the corresponding lookback pre-fetch instruction in the compressed data stream.

21. The processing system of claim 20, wherein the data decompression system comprises a lookback pre-fetch buffer configured to store data pre-fetched for corresponding lookback instructions during decompression.

22. The processing system of claim 21, wherein the data decompression system further comprises a lookback output buffer configured to:

store a plurality of recently decompressed data blocks; and responsive to a lookback pre-fetch instruction requesting a decompressed data block from a lookback buffer index, wherein a lookback pre-fetch buffer position of a most recently stored data block in the lookback pre-fetch buffer minus a lookback pre-fetch buffer position of a data block requested by the lookback pre-fetch instruction is less than a number of entries in the lookback output buffer, provide the decompressed data block from the lookback output buffer.

23. The processing system of claim 20, wherein the compression engine is further configured to move the lookback buffer index by being configured to move a lookback buffer index of a first lookback instruction into a lookback pre-fetch instruction in the compressed data stream that is scheduled to be accessed during decompression before a first instruction in the compressed data stream.

24. The processing system of claim 23, wherein the compression engine is further configured to move the lookback buffer index by being configured to move the lookback buffer index of each lookback instruction in the compressed data stream other than the first lookback instruction into a lookback pre-fetch instruction in the compressed data stream that is scheduled to be accessed with a closest previous lookback instruction during decompression.

25. The processing system of claim 24, wherein the compression engine is further configured to add a dummy lookback pre-fetch instruction to a last lookback instruction in the compressed data stream.

26. The processing system of claim 20, wherein the compression engine is further configured to move the lookback buffer index by being configured to:

determine a maximum number of lookback instructions in the compressed data stream within an instruction window, wherein the instruction window is sized to encompass a certain number of instructions in the compressed data stream; and move each lookback buffer index of a first plurality of lookback instructions in the compressed data stream to corresponding lookback pre-fetch instructions in the compressed data stream that are scheduled to be accessed during decompression before a first instruction in the compressed data stream, wherein a number of the first plurality of lookback instructions equals the maximum number of lookback instructions.

27. The processing system of claim 26, wherein the compression engine is further configured to move the lookback buffer index by being configured to:

move the lookback buffer index corresponding to each lookback instruction that is not one of the first plurality of lookback instructions into a lookback pre-fetch instruction in the compressed data stream that is scheduled to be accessed with a previous lookback instruction during decompression, wherein the previous lookback instruction is the lookback instruction that is the maximum number of lookback instructions prior to a current lookback instruction.

28. The processing system of claim 27, wherein the compression engine is further configured to add a dummy lookback pre-fetch instruction to each lookback instruction of a last plurality of lookback instructions in the compressed data stream, wherein a number of the last plurality of lookback instructions equals the maximum number of lookback instructions.

* * * * *